US008416018B2

(12) United States Patent
Yamauchi et al.

(10) Patent No.: US 8,416,018 B2
(45) Date of Patent: Apr. 9, 2013

(54) VARIABLE FREQUENCY AMPLIFIER

(75) Inventors: Kazuhisa Yamauchi, Tokyo (JP);
Hidenori Yukawa, Tokyo (JP); Akira Inoue, Tokyo (JP); Atsushi Yamamoto, Tokyo (JP); Koichi Fujisaki, Tokyo (JP); Hiroomi Ueda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/058,008

(22) PCT Filed: Nov. 4, 2009

(86) PCT No.: PCT/JP2009/005850
§ 371 (c)(1),
(2), (4) Date: Feb. 8, 2011

(87) PCT Pub. No.: WO2010/052901
PCT Pub. Date: May 14, 2010

(65) Prior Publication Data
US 2011/0140776 A1 Jun. 16, 2011

(30) Foreign Application Priority Data
Nov. 10, 2008 (JP) ................................. 2008-287879

(51) Int. Cl.
*H03F 3/68* (2006.01)
(52) U.S. Cl.
USPC .................. 330/124 R; 330/295; 330/107
(58) Field of Classification Search .................. 330/295, 330/124 R, 107
See application file for complete search history.

(56) References Cited

U.S. PATENT DOCUMENTS

| 4,072,897 | A | | 2/1978 | Takayama | |
|---|---|---|---|---|---|
| 4,339,773 | A | * | 7/1982 | Chemin et al. | 348/707 |
| 6,006,111 | A | * | 12/1999 | Rowland | 455/561 |
| 6,211,734 | B1 | * | 4/2001 | Ahn | 330/149 |
| 6,799,020 | B1 | * | 9/2004 | Heidmann et al. | 455/103 |

(Continued)

FOREIGN PATENT DOCUMENTS

| JP | 52 51875 | 4/1977 |
|---|---|---|
| JP | 6 347495 | 12/1994 |

(Continued)

OTHER PUBLICATIONS

Fukuda, A., et al., "Highly Efficient Triple-band Power Amplifier Employing MEMS Switches," Institute of Electronics, Information and Communication Engineers Electronics Society Convention C-2-9, p. 30, (2005).

(Continued)

*Primary Examiner* — Patricia Nguyen
(74) *Attorney, Agent, or Firm* — Oblon, Spivak, McClelland, Maier & Neustadt, L.L.P.

(57) ABSTRACT

A variable frequency amplifier includes a main amplifier system 4 for amplifying one of signals into which an input signal is split by a directional coupler 3 to output the amplified signal, and an injection amplifier system 9 for adjusting at least one of the amplitude and phase of the other one of the signals into which the input signal is split by the directional coupler 3 according to a setting provided thereto from outside the variable frequency amplifier, and for amplifying the other signal and injecting this amplified signal into an output side of the main amplifier system 4.

15 Claims, 6 Drawing Sheets

U.S. PATENT DOCUMENTS

| | | | |
|---|---|---|---|
| 6,825,719 B1 * | 11/2004 | Barak et al. | 330/129 |
| 6,894,562 B2 | 5/2005 | Nakayama et al. | |
| 7,183,843 B1 * | 2/2007 | Jones et al. | 330/124 R |
| 7,965,136 B2 * | 6/2011 | Rhodes et al. | 330/2 |

FOREIGN PATENT DOCUMENTS

| | | |
|---|---|---|
| JP | 8 8660 | 1/1996 |
| JP | 2002 76781 | 3/2002 |
| JP | 2004 301562 | 10/2004 |
| JP | 2006 166141 | 6/2006 |

OTHER PUBLICATIONS

International Search Report issued Feb. 2, 2010 in PCT/JP09/005850 filed Nov. 4, 2009.

* cited by examiner

FIG.5

| Frequency[Hz] | Output Power[dBm]* |
|---|---|
| 2.00E9 | -3.38 |
| 2.20E9 | -3.05 |
| 2.40E9 | -2.80 |
| 2.60E9 | -2.60 |
| 2.80E9 | -2.44 |
| 3.00E9 | -2.31 |
| 3.20E9 | -2.22 |
| 3.40E9 | -2.21 |
| 3.60E9 | -2.33 |
| 3.80E9 | -2.73 |
| 4.00E9 | -3.70 |
| 4.20E9 | -6.12 |
| 4.40E9 | -22.14 |
| 4.60E9 | -5.77 |
| 4.80E9 | -3.39 |
| 5.00E9 | -2.54 |
| 5.20E9 | -2.36 |
| 5.40E9 | -2.56 |
| 5.60E9 | -3.06 |
| 5.80E9 | -4.00 |
| 6.00E9 | -5.78 |
| 6.20E9 | -10.24 |
| 6.40E9 | -10.72 |
| 6.60E9 | -6.24 |
| 6.80E9 | -4.66 |
| 7.00E9 | -4.00 |
| 7.20E9 | -3.77 |
| 7.40E9 | -3.74 |
| 7.60E9 | -3.82 |
| 7.80E9 | -3.95 |
| 8.00E9 | -4.11 |

*Output Power of Main Amplifier System Excluding Electric Power Injected from Injection Amplifier System

FIG.7

| Frequency[Hz] | Output Power[dBm]* |
|---|---|
| 2.00E9 | -3.49 |
| 2.10E9 | -3.60 |
| 2.20E9 | -3.73 |
| 2.30E9 | -3.86 |
| 2.40E9 | -4.00 |
| 2.50E9 | -4.16 |
| 2.60E9 | -4.35 |
| 2.70E9 | -4.55 |
| 2.80E9 | -4.79 |
| 2.90E9 | -5.06 |
| 3.00E9 | -5.40 |
| 3.10E9 | -5.81 |
| 3.20E9 | -6.33 |
| 3.30E9 | -7.03 |
| 3.40E9 | -8.00 |
| 3.50E9 | -9.50 |
| 3.60E9 | -12.36 |
| 3.70E9 | -23.42 |
| 3.80E9 | -11.16 |
| 3.90E9 | -8.01 |
| 4.00E9 | -6.06 |
| 4.10E9 | -4.65 |
| 4.20E9 | -3.60 |
| 4.30E9 | -2.82 |
| 4.40E9 | -2.29 |
| 4.50E9 | -1.99 |
| 4.60E9 | -1.91 |
| 4.70E9 | -2.05 |
| 4.80E9 | -2.38 |
| 4.90E9 | -2.91 |
| 5.00E9 | -3.63 |
| 5.10E9 | -4.57 |
| 5.20E9 | -5.81 |
| 5.30E9 | -7.53 |
| 5.40E9 | -10.32 |
| 5.50E9 | -19.31 |
| 5.60E9 | -11.76 |
| 5.70E9 | -8.48 |
| 5.80E9 | -6.71 |

*Output Power of Main Amplifier System Excluding Electric Power Injected from Injection Amplifier System

| | Main Amplifier System Output* | | |
|---|---|---|---|
| | Before Improved [mW] | After Improved [mW] | Power Increase (Times) |
| 6GHz | 69 | 130 | 1.9 |
| 8GHz | 114 | 144 | 1.3 |
| 12GHz | 66 | 71 | 1.1 |
| 16GHz | 106 | 111 | 1.0 |
| 18GHz | 100 | 110 | 1.1 |

*Output Power of Main Amplifier System
Excluding Electric Power Injected from
Injection Amplifier System

VARIABLE FREQUENCY AMPLIFIER

FIELD OF THE INVENTION

The present invention relates to a variable frequency amplifier that can establish matching at an arbitrary frequency.

BACKGROUND OF THE INVENTION

Many functions of radio communication equipment have been implemented via hardware since utilization of radio communications.

Radio communication methods including frequencies and modulation methods are diversified, and a number of radio communication methods coexist today.

Because hardware is required for each frequency and each modulation method in order to support a plurality of radio communication methods, there is a trend toward upsizing of radio equipment.

Therefore, software defined radio equipment which can support a plurality of radio communication methods by changing its frequency and its modulation method using software has been desired.

Because software defined radio equipment does not have to provide hardware for each frequency and every modulation method, the radio equipment can be downsized.

A power amplifier mounted in software defined radio equipment needs to cover all a frequency range defined by software, and is required to operate over a large frequency range.

As a method of acquiring a high-efficient characteristic, a high-output characteristic and a wide-band characteristic in a case of implementing such a power amplifier using a single amplifier, a method of switching among matching circuits of the power amplifier for each of frequencies has been proposed, for example.

For example, an output matching circuit for use in a variable frequency amplifier (triple-band power amplifier) is disclosed by the following nonpatent reference 1. This variable frequency amplifier switches among configurations of the output matching circuit by turning on and off two MEMS switches according to a frequency, thereby making it possible to establish matching at any of three frequencies.

RELATED ART DOCUMENT

Nonpatent Reference

Nonpatent reference 1: Fukuda et al., "Highly Efficient Triple-band Power Amplifier Employing MEMS Switches", Institute of Electronics, Information and Communication Engineers Electronics Society Convention C-2-9, 2005

Because the conventional variable frequency amplifier is constructed as above, the conventional variable frequency amplifier can establish matching at any of three frequencies by turning on and off the two MEMS switches. However, in order to make it possible to establish matching at any of a larger number of frequencies, the conventional variable frequency amplifier has to have many switches mounted therein for switching among matching states. A problem is therefore that because the loss increases and the efficiency drops as the structure of the output matching circuit becomes complicated, there is a practical limitation on the number of frequencies among which the conventional variable frequency amplifier can switch, for example.

The present invention is made in order to solve the above-mentioned problem, and it is therefore an object of the present invention to provide a variable frequency amplifier that can establish matching at an arbitrary frequency without causing any increase in the loss.

In accordance with the present invention, there is provided a variable frequency amplifier including: a main amplifying means for amplifying one of signals into which an input signal is split by a signal splitting means to output the amplified signal; and an injection amplifying means for adjusting at least one of an amplitude and a phase of another one of the signals into which the input signal is split by the signal splitting means according to a setting provided thereto from outside the variable frequency amplifier, and for amplifying the other signal and injecting this amplified signal into an output side of the main amplifying means.

Because the variable frequency amplifier in accordance with the present invention is constructed in such a way as to include the main amplifying means for amplifying one of the signals into which the input signal is split by the signal splitting means to output the amplified signal, and the injection amplifying means for adjusting at least one of the amplitude and phase of the other one of the signals into which the input signal is split by the signal splitting means according to the setting provided thereto from outside the variable frequency amplifier, and for amplifying the other signal and injecting this amplified signal into the output side of the main amplifying means, there is provided an advantage of being able to establish matching at an arbitrary frequency without causing any increase in the loss.

BRIEF DESCRIPTION OF THE FIGURES

FIG. 5 is an explanatory drawing showing the results of calculation of the frequency dependence of the output power of the main amplifier system 4 excluding the electric power of a signal injected from the injection amplifier system 9;

FIG. 7 is an explanatory drawing showing the results of the calculation of the frequency dependence of the output power of the main amplifier system 4 excluding the electric power of the signal injected from the injection amplifier system 9;

EMBODIMENTS OF THE INVENTION

Hereafter, in order to explain this invention in greater detail, the preferred embodiments of the present invention will be described with reference to the accompanying drawings.

Embodiment 1

Figure 1:
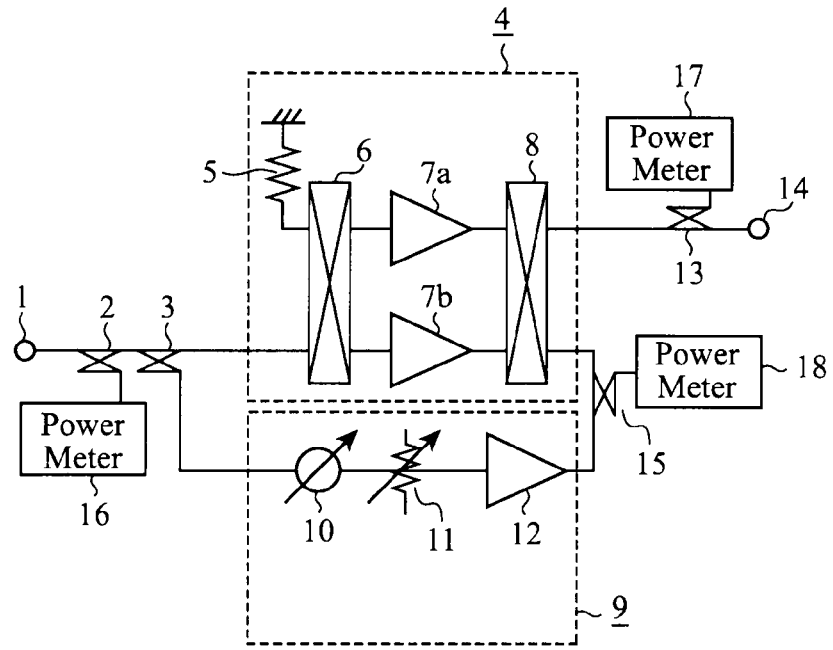
FIG. 1 is a block diagram showing a variable frequency amplifier in accordance with Embodiment 1 of the present invention.

FIG. 1 is a block diagram showing a variable frequency amplifier in accordance with Embodiment 1 of the present invention.

In FIG. 1, an input terminal 1 is a terminal via which the variable frequency amplifier receives a signal to be amplified.

A directional coupler 2 is a splitter for splitting the signal inputted via the input terminal 1 (referred to as the "input signal" from here on) into a signal for a directional coupler 3 and a signal for a power meter 16.

The directional coupler 3 is a splitter for splitting one of the signals into which the input signal is split by the directional coupler 2 into a signal for a main amplifier system 4 and a signal for an injection amplifier system 9.

The directional coupler 3 constructs a signal splitting means.

The main amplifier system 4 is a balanced type amplifier which is comprised of 3 dB directional couplers 6 and 8, unit amplifiers 7a and 7b, and so on. The main amplifier system 4 receives an injection of an output signal of the injection amplifier system 9 via an output side of the 3 dB directional coupler 8 which is an isolation port disposed on an output side thereof, while amplifying an input one of the signals split by the directional coupler 3 and then outputting the amplified signal to an output terminal 14. The main amplifier system 4 constructs a main amplifying means.

An isolation resistor 5 of the main amplifier system 4 has an end which is grounded and another end which is connected to an input side of the 3 dB directional coupler 6.

The input side of the 3 dB directional coupler 6 is connected to the isolation resistor 5 and the directional coupler 3, and the 3 dB directional coupler 6 is a splitter for splitting the input one of the signals split by the directional coupler 3 into a signal for the unit amplifier 7a and a signal for the unit amplifier 7b.

The unit amplifiers 7a and 7b construct the main amplifier, amplify the signals split by the 3 dB directional coupler 6 and input thereto respectively, and output the amplified signals to the 3 dB directional coupler 8.

The 3 dB directional coupler 8 has an input side which is connected to the unit amplifiers 7a and 7b, and the output side of the 3 dB directional coupler 8 is connected to the output terminal 14 and the injection amplifier system 9 via directional couplers 13 and 15. The 3 dB directional coupler 8 is a splitter for receiving an injection of the output signal of the injection amplifier system 9 while outputting the signals amplified by the unit amplifiers 7a and 7b to the output terminal 14.

The injection amplifier system 9 adjusts the amplitude and phase of the other input one of the two signals into which the signal input to the directional coupler 3 is split by the directional coupler 3 according to settings provided thereto from outside the variable frequency amplifier, and also amplifies the other input signal inputted thereto and injects the amplified signal into the output side of the main amplifier system 4. The injection amplifier system 9 constructs an injection amplifying means.

A phase shifter 10 of the injection amplifier system 9 is a phase shift means for adjusting the phase of the other input signal according to a setting provided thereto from outside the variable frequency amplifier.

An attenuator 11 is an attenuating means for adjusting the amplitude of the other input signal according to a setting provided thereto from outside the variable frequency amplifier.

An injection amplifier 12 amplifies the signal whose amplitude has been adjusted by the attenuator 11, and injects the amplified signal into the output side of the injection amplifier system 9.

The directional coupler 13 is a splitter for splitting the output signal of the main amplifier system 4 into a signal for the output terminal 14 and a signal for the power meter 17.

The output terminal 14 is a terminal via which the variable frequency amplifier outputs one of the signals into which the output signal of the main amplifier system is split by the directional coupler 13.

The directional coupler 15 is a splitter for splitting the output signal of the injection amplifier system 9 into a signal for the output side of the main amplifier system 4 and a signal for the power meter 18.

The power meter 16 is display equipment for measuring the electric power of the signal inputted thereto and displays the electric power of the input signal.

The power meter 17 is first display equipment for measuring the electric power of the output signal of the main amplifier system 4, and displays the electric power of the output signal.

The power meter 18 is second display equipment for measuring the electric power of the output signal of the injection amplifier system 9, and displays the electric power of the output signal.

Next, the operation of the variable frequency amplifier will be explained.

Figure 2:
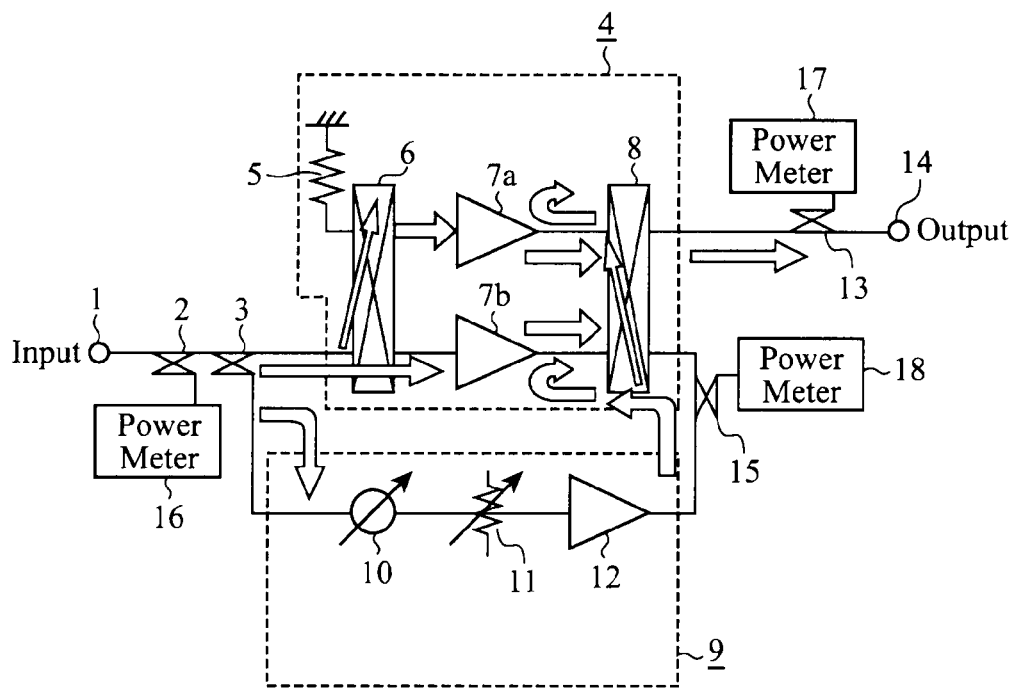
FIG. 2 is a schematic diagram showing the operation of the variable frequency amplifier of FIG. 1.

FIG. 2 is a schematic diagram showing the operation of the variable frequency amplifier shown in FIG. 1.

When a signal is inputted to the variable frequency amplifier via the input terminal 1, the directional coupler 2 splits the input signal into a signal for the directional coupler 3 and a signal for the power meter 16.

When receiving the one of the split input signals from the directional coupler 2, the directional coupler 3 further splits the input signal into a signal for the main amplifier system 4 and a signal for the injection amplifier system 9.

When receiving the one of the split input signals from the directional coupler 3, the main amplifier system 4 amplifies the input signal and then outputs the amplified signal to the output terminal 14.

More specifically, when receiving the one of the split input signals from the directional coupler 3, the 3 dB directional coupler 6 of the main amplifier system 4 further splits the input signal into signals for the unit amplifiers 7a and 7b.

When receiving the one of the split input signals from the 3 dB directional coupler 6, each of the unit amplifiers 7a and 7b of the main amplifier system 4 amplifies the input signal and then outputs the amplified signal to the 3 dB directional coupler 8.

When receiving the amplified signals from the unit amplifiers 7a and 7b, the 3 dB directional coupler 8 of the main amplifier system 4 outputs the amplified signals to the output terminal 14.

At this time, a reflection coefficient Γa viewed from a load side to the output side of the main amplifier system 4 and a reflection coefficient Γ viewed from the output side of the main amplifier system 4 to the load side has a relationship of complex conjugate: Γ=Γa*, the largest output power can be extracted from the main amplifier system 4.

At the output end of the main amplifier system 4, the reflection coefficient Γ viewed from the output side of the main amplifier system 4 to the load side in a case in which the output signal of the injection amplifier system 9 is not injected is defined as shown in the following equation (1).

$$\Gamma = \frac{Vr \cdot e^{j\theta r}}{Vi \cdot e^{j\theta i}} \quad (1)$$

where Vr shows the voltage amplitude of a signal going from the load side to the output side of the main amplifier system 4, and θr shows the phase of the signal going from the load side to the output side of the main amplifier system 4.

Furthermore, Vi shows the voltage amplitude of a signal going from the output side of the main amplifier system 4 to the load side, and θi shows the phase of the signal going from the output side of the main amplifier system 4 to the load side.

The signal going from the output side of the main amplifier system 4 to the load side occurs because of disagreement between the output impedance of the main amplifier system 4 and the impedance of the load.

Because the reflection coefficient Γ is shown by a voltage amplitude and phase ratio of the signal going from the load side to the output side of the main amplifier system 4, and the signal going from the output side of the main amplifier system 4 to the load side, as shown in the equation (1), it is understood that the reflection coefficient Γ changes as the voltage amplitude and phase of the signal going from the load side to the output side of the main amplifier system 4 change.

On the other hand, when the injection amplifier system 9 receives the split input signal from the directional coupler 3, the phase shifter 10 and attenuator 11 which are built in the injection amplifier system adjust the phase and amplitude of the input signal according to the settings (values set by the user) which are provided thereto from outside the variable frequency amplifier, and the injection amplifier 12 which is built in the injection amplifier system amplifies the adjusted signal and then injects the amplified signal into the output side of the injection amplifier system 9.

Because the signal going from the load side to the output side of the main amplifier system 4 is shown by the sum of the signal injected from the injection amplifier system 9, and the reflected wave occurring because of disagreement between output impedance of the main amplifier system 4 and the impedance of the load, the reflection coefficient Γ at the time of the injection of the output signal of the main amplifier system 4 is defined as shown in the following equation (2).

$$\Gamma = \frac{Vr \cdot e^{j\theta r} + Vj \cdot e^{j\theta j}}{Vi \cdot e^{j\theta i} - Vj \cdot e^{j\theta j}} \quad (2)$$

where Vj shows the voltage amplitude of the signal injected from the injection amplifier system 9, and θj shows the phase of the signal injected from the injection amplifier system 9.

When the voltage amplitude Vj and phase θj of the signal which are injected from the injection amplifier system 9 are set appropriately in such a way that the relationship of complex conjugate Γ=Γa* is established, matching can be established in the main amplifier system 4.

Because the output of the main amplifier system 4 excluding the electric power of the signal injected from the injection amplifier system 9 is maximized in a state in which matching is established in the main amplifier system 4, it is understood that what is necessary is just to set the phase shifter 10 and the attenuator 11 of the injection amplifier system 9 in such a way that the output of the main amplifier system 4 is maximized.

The output power of the variable frequency amplifier is measured and displayed by the power meter 17.

Furthermore, the electric power of the signal injected from the injection amplifier system 9 into the main amplifier system 4 is measured and displayed by the power meter 18.

The output of the main amplifier system 4 excluding the electric power of the signal injected from the injection amplifier system 9 can be determined from the difference between the electric power displayed by the power meter 17 and the electric power displayed by the power meter 18.

It can be understood from the above explanation that by setting the phase shifter 10 and the attenuator 11 of the injection amplifier system 9 in such a way that the difference between the electric power displayed by the power meter 17 and the electric power displayed by the power meter 18 is maximized, matching can be established in the main amplifier system 4 at an arbitrary frequency.

In order to verify that matching can be established in the main amplifier system at an arbitrary frequency, the input and output reflection characteristics of the main amplifier system 4 in the variable frequency amplifier of FIG. 1 will be calculated hereafter.

Figure 3:
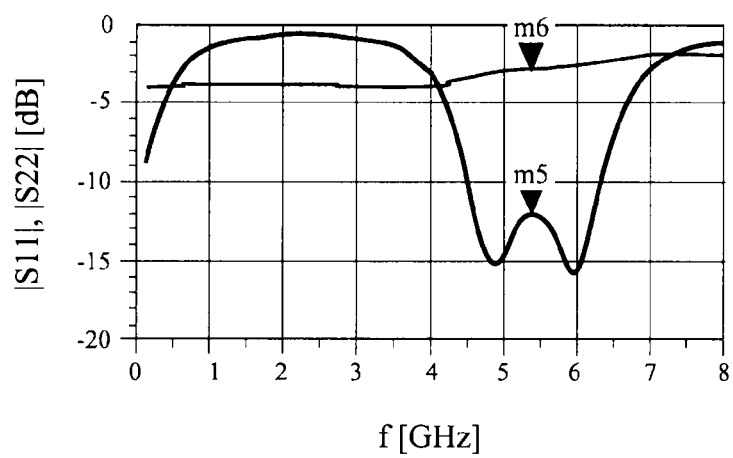
FIG. 3 is an explanatory drawing showing the results of calculation of the input and output reflection characteristics of a main amplifier system 4.

FIG. 3 is an explanatory drawing showing the results of the calculation of the input and output reflection characteristics of the main amplifier system 4. The curved line shown in FIG. 3 is the result of the calculation of the input reflection characteristic, and the approximately straight line upwardly slanting to the right is the result of the calculation of the output reflection characteristic.

The reflection characteristic of the output side of the main amplifier system 4 is determined to be substantially "−3 dB" at a frequency range from 0 GHz to 8 GHz. The variable frequency amplifier is constructed using this amplifier.

Figure 4:
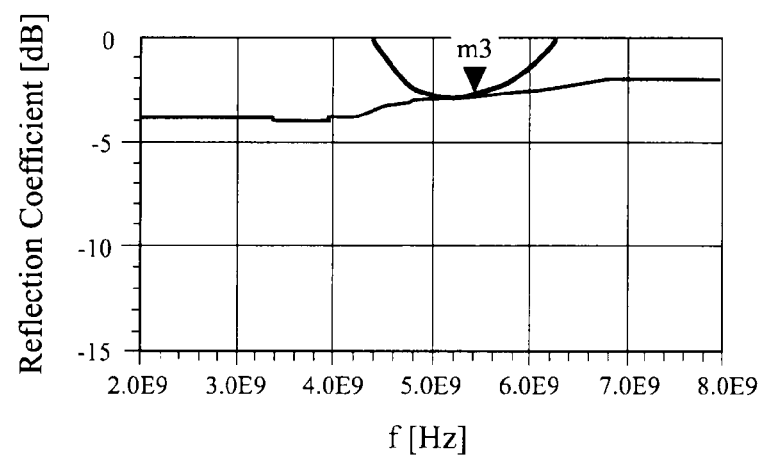
FIG. 4 is an explanatory drawing showing the results of the calculation of the output reflection characteristic at the main amplifier system of the variable frequency amplifier in a case in which a phase shifter 10 and an attenuator 11 of an injection amplifier system 9 are set in such a way that the output of the main amplifier system 4 is maximized at 5.4 GHz.

FIG. 4 is an explanatory drawing showing the results of the calculation of the output reflection characteristic at the main amplifier system of the variable frequency amplifier in a case in which the phase shifter 10 and the attenuator 11 of the injection amplifier system 9 are set in such a way that the output of the main amplifier system 4 is maximized at 5.4 GHz. The curved line shown in FIG. 4 is the result of the calculation of the reflection characteristic at the main amplifier system of the variable frequency amplifier, and the approximately straight line upwardly slanting to the right is the result of the calculation of the output reflection characteristic of the main amplifier system.

As can be seen from FIG. 4, it can be verified that the same reflection coefficient as the reflection coefficient of the output side of the main amplifier system 4 is acquired at 5.4 GHz.

FIG. 5 is an explanatory drawing showing the results of calculation of the frequency dependence of the output power of the main amplifier system 4 excluding the electric power of the signal injected from the injection amplifier system 9.

As can be seen from FIG. 5, it can be verified that maximum output power is acquired at about 5.4 GHz.

Next, in order to verify that matching can be established even if the frequency is changed, the matching frequency is changed to 4.5 GHz.

Figure 6:
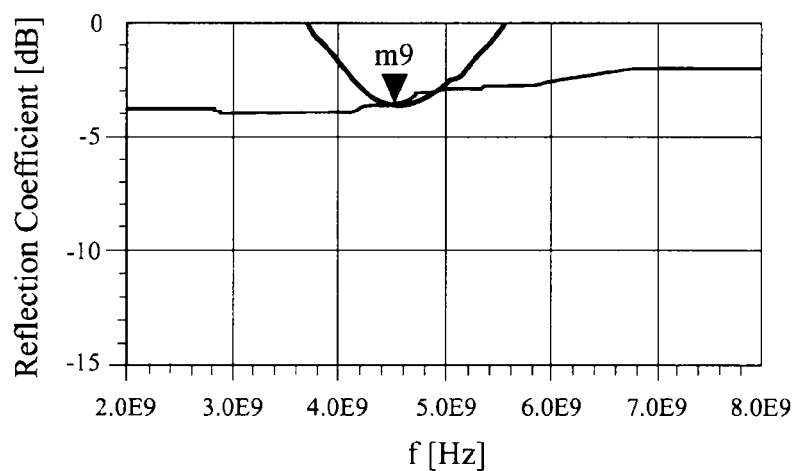
FIG. 6 is an explanatory drawing showing the results of the calculation of the output reflection characteristic at the main amplifier system of the variable frequency amplifier.

FIG. 6 is an explanatory drawing showing the results of the calculation of the output reflection characteristic at the main amplifier system of the variable frequency amplifier. The curved line shown in FIG. 6 is the result of the calculation of the reflection characteristic at the main amplifier system of the variable frequency amplifier, and the approximately straight line upwardly slanting to the right is the result of the calculation of the output reflection characteristic of the main amplifier system.

As can be seen from FIG. 6, it can be verified that the same reflection coefficient as the reflection coefficient of the output side of the main amplifier system 4 is acquired at 4.5 GHz.

FIG. 7 is an explanatory drawing showing the results of the calculation of the frequency dependence of the output power of the main amplifier system 4 excluding the electric power of the signal injected from the injection amplifier system 9.

As can be seen from FIG. 7, it can be verified that maximum output power is acquired at about 4.5 GHz.

As mentioned above, it can be verified by calculation that the variable frequency amplifier shown in FIG. 1 can establish matching at an arbitrary frequency.

Next, a prototype of the variable frequency amplifier of FIG. 1 which is produced in order to verify that the variable frequency amplifier can actually establish matching at an arbitrary frequency will be explained.

As the unit amplifiers 7a and 7b of the main amplifier system 4, MMIC amplifiers each of which provides about 20 dBm saturation electric power in a band of 6 GHz to 18 GHz and with an output impedance of 50 ohms are used.

The output side of each of the MMIC amplifiers has a reflection coefficient of about −3 dB at about 6 GHz, and a reflection coefficient of about −20 dB at about 18 GHz.

The output power characteristic of the variable frequency amplifier in which matching was established at each of frequencies ranging from 6 GHz to 18 GHz was measured.

Figures 8, 9:
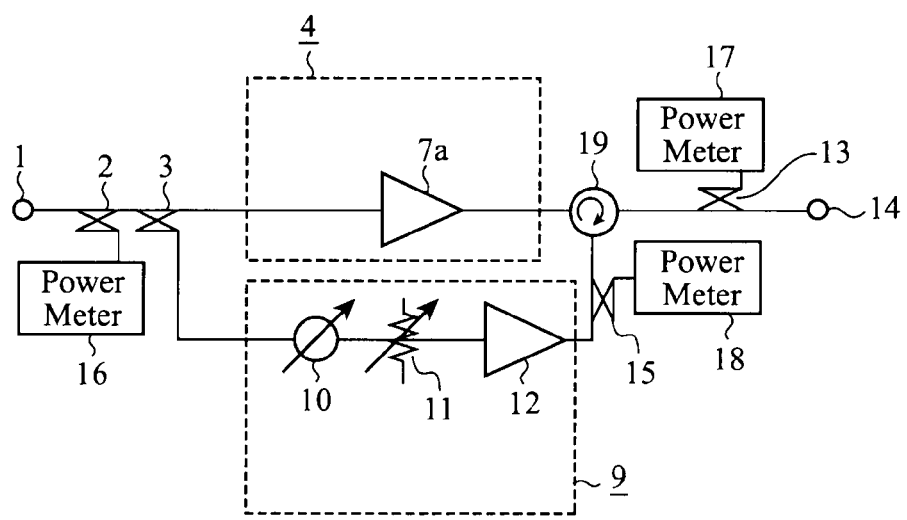
FIG. 8 is an explanatory drawing showing the results of measurement of the output power of the main amplifier system 4 excluding the electric power of the signal injected from the injection amplifier system 9.
FIG. 9 is a block diagram showing a variable frequency amplifier in accordance with Embodiment 6 of the present invention.

FIG. 8 is an explanatory drawing showing the results of the measurement of the output power of the main amplifier system 4 excluding the electric power of the signal injected from the injection amplifier system 9.

It can be verified from this figure that injecting the output signal of the injection amplifier system 9 into the output side of the main amplifier system 4 to change the output reflection coefficient of the main amplifier system 4 greatly improves the output power at about 6 GHz.

In contrast, it can be verified that the output hardly varies at about 18 GHz.

This is assumed to be because while the output reflection characteristic of the main amplifier system 4 is bad and therefore matching is not established at 6 GHz, the output reflection characteristic is good and therefore matching is established at 18 GHz.

It is thus verified by calculation and by actual measurement that the variable frequency amplifier shown in FIG. 1 can establish matching at an arbitrary frequency.

As can be seen from the above description, the variable frequency amplifier in accordance with this Embodiment 1 is constructed in such a way as to include the main amplifier system 4 for amplifying one of the input signals split by the directional coupler 3 and then outputting this amplified signal, and the injection amplifier system 9 for adjusting the amplitude and phase of the other one of the input signals split by the directional coupler 3 according to settings provided thereto from outside the variable frequency amplifier, and for amplifying the other input signal and then injecting this amplified signal into the output side of the main amplifier system 4, the variable frequency amplifier provides an advantage of being able to establish matching at an arbitrary frequency without causing any increase in the loss.

More specifically, by injecting the output signal of the injection amplifier system 9 into the output side of the main amplifier system 4, the variable frequency amplifier can electrically change the reflection coefficient Γ viewed from the output side of the main amplifier system 4 so as to establish matching at a single frequency within an adjustable frequency band. Therefore, there is provided an advantage of not imposing any limitation on the number of matching frequencies.

Furthermore, because the variable frequency amplifier does not use any switches, unlike conventional examples, the variable frequency amplifier has an advantage of reducing the matching circuit loss to a small value.

In addition, because the electric power of the signal injected from the injection amplifier system 9 into the main amplifier system 4 is reflected at the output end of the main amplifier system 4 and is then guided to the output end of the variable frequency amplifier, the variable frequency amplifier has an advantage of preventing a loss from occurring in the output matching circuit.

There are provided further advantages of eliminating durability problems and reducing the time required to switch among frequencies because the variable frequency amplifier does not use any switches.

In this Embodiment 1, the case in which the injection amplifier system 9 is made to operate also at a frequency at which the main amplifier system 4 has a good output reflection coefficient is shown. As an alternative, the injection amplifier system 9 can be made to operate only at a frequency at which the main amplifier system 4 exhibits a bad output reflection characteristic. Furthermore, the injection amplifier system 9 can be made to operate according to the output power of the main amplifier system 4.

Also in this Embodiment 1, the case in which the directional coupler 3 splits the input signal into two signals and furnishes these signals to the main amplifier system 4 and the injection amplifier system 9 respectively is shown. As an alternative, the variable frequency amplifier can furnish a signal which is synchronized with an input signal furnished to the main amplifier system 4 and which is the same as the above-mentioned input signal to the injection amplifier system 9

More specifically, the variable frequency amplifier can furnish signals from separate signal sources, the signals being the same as each other, to the main amplifier system 4 and the injection amplifier system 9 respectively.

Furthermore, in this Embodiment 1, the case in which the phase shifter 10 and the attenuator 11 are disposed on the input side of the injection amplifier 12 is shown. As an alternative, the phase shifter 10 and the attenuator 11 can be disposed on the output side of the injection amplifier 12.

Also in this Embodiment 1, the case in which both the phase shifter 10 and the attenuator 11 are mounted in the injection amplifier system 9 is shown, although the variable frequency amplifier can establish matching at an arbitrary frequency without causing any increase in the loss as long as at least one of the phase shifter 10 and the attenuator 11 is mounted in the injection amplifier system 9.

Embodiment 2

In above-mentioned Embodiment 1, the variable frequency amplifier in which the injection amplifier system 9 has the injection amplifier 12 mounted therein is shown, although instead of the attenuator 11 and the injection amplifier 12, the injection amplifier system 9 can have a gain variable amplifier mounted therein.

As a result, this embodiment offers an advantage of being able to simplify the structure of the injection amplifier system 9.

Embodiment 3

In above-mentioned Embodiment 1, the variable frequency amplifier in which the injection amplifier system 9 has the phase shifter 10 and the phase shifter 10 adjusts the phase of the input signal is shown, although the injection amplifier system 9 can alternatively use an amplifier capable of controlling a bias voltage, as the injection amplifier 12 of the injection amplifier system 9, to adjust the phase of the input signal by controlling the bias voltage of the amplifier.

As a result, because the injection amplifier system 9 does not have to have the phase shifter 10 mounted therein, this embodiment offers an advantage of being able to simplify the structure of the injection amplifier system 9.

Embodiment 4

In above-mentioned Embodiment 1, the variable frequency amplifier in which the directional coupler 3 splits the input signal into a signal for the main amplifier system 4 and a signal for the injection amplifier system 9. When splitting the input signal, the directional coupler 3 can adjust the split ratio of the signal inputted to the main amplifier system 4 and the other signal inputted to the injection amplifier system 9.

In this case, even though the injection amplifier system 9 does not have the phase shifter 10 and the attenuator 11 mounted therein, matching can be established at an arbitrary frequency without causing any increase in the loss.

Therefore, this embodiment offers an advantage of being able to simplify the structure of the injection amplifier system 9.

Embodiment 5

In above-mentioned Embodiment 1, the variable frequency amplifier in which the directional coupler 3 splits the input signal into a signal for the main amplifier system 4 and a signal for the injection amplifier system 9 is shown. When splitting the input signal, the directional coupler 3 can adjust the phase of the signal inputted to the main amplifier system 4 and that of the other signal inputted to the injection amplifier system 9.

In this case, even though the injection amplifier system 9 does not have the phase shifter 10 and the attenuator 11 mounted therein, matching can be established at an arbitrary frequency without causing any increase in the loss.

Therefore, this embodiment offers an advantage of being able to simplify the structure of the injection amplifier system 9.

Embodiment 6

FIG. 9 is a block diagram showing a variable frequency amplifier in accordance with Embodiment 6 of the present invention. In the figure, because the same reference numerals as those shown in FIG. 1 denote the same components or like components, the explanation of these components will be omitted hereafter.

A circulator 19 is connected to an output side of a main amplifier system 4, and an output side of an injection amplifier system 9 is connected to an isolation port of the circulator 19.

The variable frequency amplifier of FIG. 9 operates fundamentally in the same way that the variable frequency amplifier of FIG. 1 does. By connecting the circulator 19 to the output side of the main amplifier system 4 and also connecting the output side of the injection amplifier system 9 to the isolation port of the circulator 19, as shown in FIG. 9, the main amplifier system 4 can consist of only a single unit amplifier 7a, instead of a balanced type amplifier like the main amplifier system 4 in the variable frequency amplifier of FIG. 1.

Therefore, the variable frequency amplifier can consist of even such an amplifier having a general structure which is not of balanced type.

Furthermore, because the circulator 19 is connected to the output side of the main amplifier system 4, the reflection characteristic of the main amplifier system 4 is hard to be affected by any external influence, errors of the settings of the amplitude and phase in the injection amplifier system 9 can be reduced.

Embodiment 7

In above-mentioned Embodiment 1, the variable frequency amplifier in which no delay circuits are mounted in the main amplifier system 4 and the injection amplifier system 9 is shown, although a delay circuit for making a delay time of the main amplifier system 4 be equal to that of the injection amplifier system 9 (e.g., a delay circuit which consists of a delay line, a delay filter, or the like) can be mounted in at least one of the main amplifier system 4 and the injection amplifier system 9.

By thus making the delay time of the main amplifier system 4 be equal to that of the injection amplifier system 9, there is provided an advantage of being able to broaden the band of the variable frequency amplifier.

Embodiment 8

In above-mentioned Embodiment 1, the variable frequency amplifier in which by setting the phase shifter 10 and the attenuator 11 of the injection amplifier system 9 in such a way that the difference between the electric power displayed by the power meter 17 and the electric power displayed by the power meter 18 is maximized, matching is established in the main amplifier system 4 at an arbitrary frequency is shown. As an alternative, by providing a power meter (not shown) connected between the unit amplifier 7a (or the unit amplifier 7b) and the 3 dB directional coupler 8, for measuring the electric power of the output signal of the unit amplifier 7a (or the unit amplifier 7b) and displaying the electric power, and then setting the phase shifter 10 and the attenuator 11 of the injection amplifier system 9 in such a way that the difference between the electric power displayed by the power meter and the electric power displayed by the power meter 18 is maximized, matching can be established in the main amplifier system 4 at an arbitrary frequency.

Similarly, by providing a power meter (not shown) connected between the unit amplifier 7a (or the unit amplifier 7b) and the 3 dB directional coupler 8, for measuring the electric power of the signal injected from the injection amplifier system 9 and displaying the electric power, and then setting the phase shifter 10 and the attenuator 11 of the injection amplifier system 9 in such away that the difference between the electric power displayed by the power meter and the electric power displayed by the power meter 17 is maximized, matching can be established in the main amplifier system 4 at an arbitrary frequency.

As an alternative, by providing a first power meter (not shown) connected between the unit amplifier 7a (or the unit amplifier 7b) and the 3 dB directional coupler 8, for measuring the electric power of the output signal of the unit amplifier 7a (or the unit amplifier 7b) and displaying the electric power, further providing a second power meter (not shown) connected between the unit amplifier 7a (or the unit amplifier 7b)

and the 3 dB directional coupler 8, for measuring the electric power of the signal injected from the injection amplifier system 9 and displaying the electric power, and then setting the phase shifter 10 and the attenuator 11 of the injection amplifier system 9 in such a way that the difference between the electric power displayed by the first power meter and the electric power displayed by the second power meter is maximized, matching can be established in the main amplifier system 4 at an arbitrary frequency.

INDUSTRIAL APPLICABILITY

Because the variable frequency amplifier in accordance with the present invention can establish matching at an arbitrary frequency without causing any increase in the loss, the variable frequency amplifier in accordance with the present invention is suitable for use in a power amplifier or the like which is mounted in a software defined radio device.

The invention claimed is:

1. A variable frequency amplifier comprising:
a signal splitting means for splitting an input signal;
a main amplifying means for amplifying one of signals into which the input signal is split by said signal splitting means to output the amplified signal; and
an injection amplifying means for adjusting, in accordance with a change in frequency of said input signal, at least one of an amplitude and a phase of another one of the signals into which the input signal is split by said signal splitting means according to a setting provided thereto from outside said variable frequency amplifier, and for amplifying said other signal and injecting this amplified signal into an output side of said main amplifying means.

2. A variable frequency amplifier comprising:
a main amplifying means for amplifying an input signal and outputting the signal amplified thereby; and
an injection amplifying means for inputting a same signal as said input signal, which is synchronized with said input signal, according to a setting provided thereto from outside said variable frequency amplifier, to adjust, in accordance with a frequency of said input signal, at least one of an amplitude and a phase of said inputted signal which is the same as said input signal, and for amplifying said inputted signal and injecting this amplified signal into an output side of said main amplifying means.

3. The variable frequency amplifier according to claim 1, wherein the main amplifying means includes a balanced type amplifier into which the output signal of the injection amplifying means is injected via an isolation port on an output side thereof.

4. The variable frequency amplifier according to claim 2, wherein the main amplifying means includes a balanced type amplifier into which the output signal of the injection amplifying means is injected via an isolation port on an output side thereof.

5. The variable frequency amplifier according to claim 1, wherein in the injection amplifying means, at least one of an attenuator for adjusting an amplitude of an input signal according to a setting provided thereto from outside said variable frequency amplifier and a phase shifter of adjusting a phase of said input signal according to a setting provided thereto from outside said variable frequency amplifier is mounted.

6. The variable frequency amplifier according to claim 2, wherein in the injection amplifying means, at least one of an attenuator for adjusting an amplitude of an input signal according to a setting provided thereto from outside said variable frequency amplifier and a phase shifter of adjusting a phase of said input signal according to a setting provided thereto from outside said variable frequency amplifier is mounted.

7. The variable frequency amplifier according to claim 1, wherein the injection amplifying means includes either a gain variable amplifier configured to adjust a gain of an input signal, or an amplifier whose bias voltage can be controlled in such a way as to adjust a phase of said input signal.

8. The variable frequency amplifier according to claim 2, wherein the injection amplifying means includes either a gain variable amplifier configured to adjust a gain of an input signal, or an amplifier whose bias voltage can be controlled in such a way as to adjust a phase of said input signal.

9. The variable frequency amplifier according to claim 1, wherein the signal splitting means adjusts either a splitting ratio of the signal inputted to the main amplifying means and the other signal inputted to the injection amplifying means, or the phases of the split signal inputted to the main amplifying means and the other split signal inputted to the injection amplifying means.

10. The variable frequency amplifier according to claim 1, wherein a circulator is connected to the output side of the main amplifying means, and an output side of the injection amplifying means is connected to an isolation port of said circulator.

11. The variable frequency amplifier according to claim 2, wherein a circulator is connected to the output side of the main amplifying means, and an output side of the injection amplifying means is connected to an isolation port of said circulator.

12. The variable frequency amplifier according to claim 1, wherein a delay circuit for making a delay time of the main amplifying means be equal to that of the injection amplifying means is mounted in at least one of said main amplifying means and said injection amplifying means.

13. The variable frequency amplifier according to claim 2, wherein a delay circuit for making a delay time of the main amplifying means be equal to that of the injection amplifying means is mounted in at least one of said main amplifying means and said injection amplifying means.

14. The variable frequency amplifier according to claim 1, wherein said variable frequency amplifier includes a first display unit for measuring electric power of the output signal of the main amplifying means to display said electric power, and a second display unit for measuring electric power of the signal injected from the injection amplifying means into the output side of said amplifying means to display said electric power.

15. The variable frequency amplifier according to claim 2, wherein said variable frequency amplifier includes a first display unit for measuring electric power of the output signal of the main amplifying means to display said electric power, and a second display unit for measuring electric power of the signal injected from the injection amplifying means into the output side of said amplifying means to display said electric power.

* * * * *